United States Patent
Kim et al.

(10) Patent No.: US 11,385,290 B2
(45) Date of Patent: Jul. 12, 2022

(54) BATTERY PROPERTY MEASUREMENT APPARATUS

(71) Applicant: LG CHEM, LTD., Seoul (KR)

(72) Inventors: Young Joong Kim, Daejeon (KR); Jin Hyun Lee, Daejeon (KR); Young Su Son, Daejeon (KR)

(73) Assignee: LG ENERGY SOLUTION, LTD., Seoul (KR)

(*) Notice: Subject to any disclaimer, the term of this patent is extended or adjusted under 35 U.S.C. 154(b) by 66 days.

(21) Appl. No.: 16/964,510

(22) PCT Filed: Jan. 13, 2020

(86) PCT No.: PCT/KR2020/000600
§ 371 (c)(1),
(2) Date: Jul. 23, 2020

(87) PCT Pub. No.: WO2020/153646
PCT Pub. Date: Jul. 30, 2020

(65) Prior Publication Data
US 2021/0018566 A1    Jan. 21, 2021

(30) Foreign Application Priority Data
Jan. 24, 2019    (KR) .................. 10-2019-0008997

(51) Int. Cl.
*G01R 31/364*    (2019.01)
*A41D 19/00*    (2006.01)
(Continued)

(52) U.S. Cl.
CPC .......... *G01R 31/364* (2019.01); *A41D 19/00* (2013.01); *G01R 31/385* (2019.01);
(Continued)

(58) Field of Classification Search
CPC .. G01R 31/364; G01R 31/389; G01R 31/385; A41D 19/00; H01M 10/48; H01M 2220/30
(Continued)

(56) References Cited

U.S. PATENT DOCUMENTS 5,903,154 A     5/1999  Zhang et al.
2018/0123175 A1* 5/2018 Riemer ................. H04L 67/125
(Continued)

FOREIGN PATENT DOCUMENTS

CN    202018637 U    10/2011
CN    107479004    *  9/2017    ......... G01R 31/389
(Continued)

OTHER PUBLICATIONS

Extended European Search Report for European Application No. 20733184.4, dated Feb. 17, 2021.

*Primary Examiner* — Patrick Assouad
*Assistant Examiner* — Trung Q Nguyen
(74) *Attorney, Agent, or Firm* — Birch, Stewart, Kolasch & Birch, LLP (57) ABSTRACT

Discussed is a battery property measurement apparatus including a main body made of an insulative material, the main body being configured to be put on a hand of a user; and a measurement unit installed at a portion of the main body at which a finger of the user is located, the measurement unit being configured to contact at least a portion of respective opposite ends of a battery, the measurement unit being electrically connected to the battery when the user push on the battery using the finger in a state in which the battery is coupled to the measurement unit.

13 Claims, 9 Drawing Sheets

(51) Int. Cl.
   *H01M 10/48*     (2006.01)
   *G01R 31/385*    (2019.01)
   *G01R 31/389*    (2019.01)

(52) U.S. Cl.
   CPC .......... *G01R 31/389* (2019.01); *H01M 10/48* (2013.01); *H01M 2220/30* (2013.01)

(58) Field of Classification Search
   USPC ............................... 324/400–433, 76.11, 500
   See application file for complete search history.

(56) References Cited

U.S. PATENT DOCUMENTS

| | | |
|---|---|---|
| 2020/0227790 A1 | 7/2020 | Riemer et al. |
| 2021/0119270 A1 | 4/2021 | Riemer et al. |

FOREIGN PATENT DOCUMENTS

| | | |
|---|---|---|
| CN | 107479004 A | 12/2017 |
| JP | 5-87816 U | 11/1993 |
| JP | 6-56776 U | 8/1994 |
| JP | 9-171067 A | 6/1997 |
| JP | 9-245755 A | 9/1997 |
| JP | 2005-214941 A | 8/2005 |
| JP | 2007-139475 A | 6/2007 |
| JP | 4085985 B2 | 5/2008 |
| JP | 2020-517042 A | 6/2020 |
| KR | 10-2016-0088983 A | 7/2016 |
| KR | 10-2018-0063580 A | 6/2018 |

\* cited by examiner

【FIG. 9】

BATTERY PROPERTY MEASUREMENT APPARATUS

TECHNICAL FIELD

This application claims the benefit of priority to Korean Patent Application No. 2019-0008997 filed on Jan. 24, 2019, the disclosure of which is hereby incorporated by reference herein in its entirety.

The present invention relates to a battery property measurement apparatus, and more particularly to a battery property measurement apparatus capable of being used to measure properties of a manufactured battery.

BACKGROUND ART

A battery provided as a power source of an electric device or an electrical circuit is essentially subjected to a test process of measuring whether the battery normally has predetermined power capacity after being manufactured and before being delivered.

In a general battery property measurement apparatus, a voltmeter OV is connected in series to a battery BAT in order to measure open voltage of the battery from the base voltage to the maximum voltage. In addition, a resistor is connected between opposite electrodes of the battery, a switch is connected between a positive electrode of the battery and one end of the resistor, and an ammeter is connected between opposite ends of the resistor. In this state, the switch is turned on and off at intervals of a predetermined time, such as 0.25 seconds, to measure variations of voltage with respect to current values from the base current to the maximum current based on a predetermined resistance value of the resistor R1. In addition, a bar type probe is generally used in a stationary situation, such as with respect to a breadboard or a PCB.

However, in the case in which fixing is difficult and portions to be measured (a positive electrode and a negative electrode) are spaced apart from each other in the vertical direction, like a cylindrical battery, fixing and measurement must be simultaneously performed. As a result, the contact portion of the probe is unstable, whereby a long time is taken to perform measurement. In addition, unnecessary force is applied, whereby the surface of an electrode terminal may be scratched due to frequent change in position. Furthermore, in the case in which the temperature of the battery is high or low, it may be necessary to wear heatproof gloves, whereby measurement time is further increased, and it may be difficult to accurately position the probe at the electrode terminal of the battery due to the heatproof gloves.

PRIOR ART DOCUMENT (Patent Document 1) Korean Patent Application Publication No. 2016-0088983

DISCLOSURE

Technical Problem

It is an object of the present invention to provide a battery property measurement apparatus capable of accurately measuring properties of a battery.

Technical Solution

A battery property measurement apparatus according to an aspect of the present invention includes a main body made of an insulative material, the main body being configured to be put on a hand of a user; and a measurement unit installed at the portion of the main body at which a finger of the user is located, the measurement unit being configured to wrap at least a portion of each of opposite ends of a battery, the measurement unit being electrically connected to the battery when the user pushes the battery using the finger in the state in which the battery is coupled.

Meanwhile, the measurement unit may include a positioning member including a base portion coupled to the main body, the base portion being formed so as to have a shape capable of wrapping a portion of the finger, and a gripping portion configured to wrap a portion of one end of the battery; a conductive member installed in an installation space defined in the positioning member, the conductive member being made of a conductive material, the conductive member being configured to be moved in the installation space in a direction far from or close to the finger by external force; and an elastic member installed in the installation space, the elastic member being configured to elastically support the conductive member, the elastic member applying elastic force such that the conductive member is maintained in the state of being located adjacent to the finger when the external force applied to the conductive member is removed.

Meanwhile, the gripping portion of the positioning member may include a fixing portion fixed and coupled to the base portion and a detachment portion detachably coupled to the fixing portion, the detachment portion being configured to wrap a portion of one end of the battery.

Meanwhile, the elastic member may be a compression spring.

Meanwhile, the detachment portion may have a ring shape.

Meanwhile, the inner diameter of the inner surface of the gripping portion may gradually decrease from the tip end thereof to the conductive member.

Meanwhile, the battery property measurement apparatus may further include an insulative member made of a material that is insulative and elastically deformable, the insulative member being installed in the main body, the insulative member being installed so as to wrap the portion of the conductive member that contacts the finger.

Meanwhile, the battery property measurement apparatus may include a coupling member coupled to the main body, an external device being detachably coupled to the coupling member; and a connection member made of a conductive material, the connection member being installed at the main body, the connection member being configured to electrically connect the measurement unit and the coupling member to each other.

Meanwhile, the connection member may be made of a conductive fiber.

Meanwhile, the external device may be configured to measure one or more of voltage, current, and internal resistance of the battery.

BEST MODE

Now, preferred embodiments of the present invention will be described in detail with reference to the accompanying drawings such that the preferred embodiments of the present invention can be easily implemented by a person having ordinary skill in the art to which the present invention pertains. The present invention may be embodied in various different forms, and is not limited to the embodiments described herein.

In order to clearly describe the present invention, a detailed description of parts having no relation with the description of the present invention may be omitted, and the same or similar elements are denoted by the same reference numerals throughout the specification.

Also, in the case in which various embodiments are described, components having the same constructions will be described in only a representative embodiment using the same reference symbols, and only components different from those of the representative embodiment will be described in the other embodiments.

In the case in which one part is said to be "connected" to another part throughout the specification, not only may the one part be "directly connected" to the other part, but also, the one part may be "indirectly connected" to the other part via a further part. Also, in the case in which a part "includes" a component, this means that the part may not exclude another component but may further include another component unless otherwise mentioned.

Unless otherwise defined, all terms, including technical and scientific terms, used in this specification have the same meaning as commonly understood by a person having ordinary skill in the art to which the present invention pertains. It will be further understood that terms, such as those defined in commonly used dictionaries, should be interpreted as having a meaning that is consistent with their meaning in the context of the relevant art and the present invention, and will not be interpreted in an idealized or overly formal sense unless expressly so defined herein.

Figure 1:
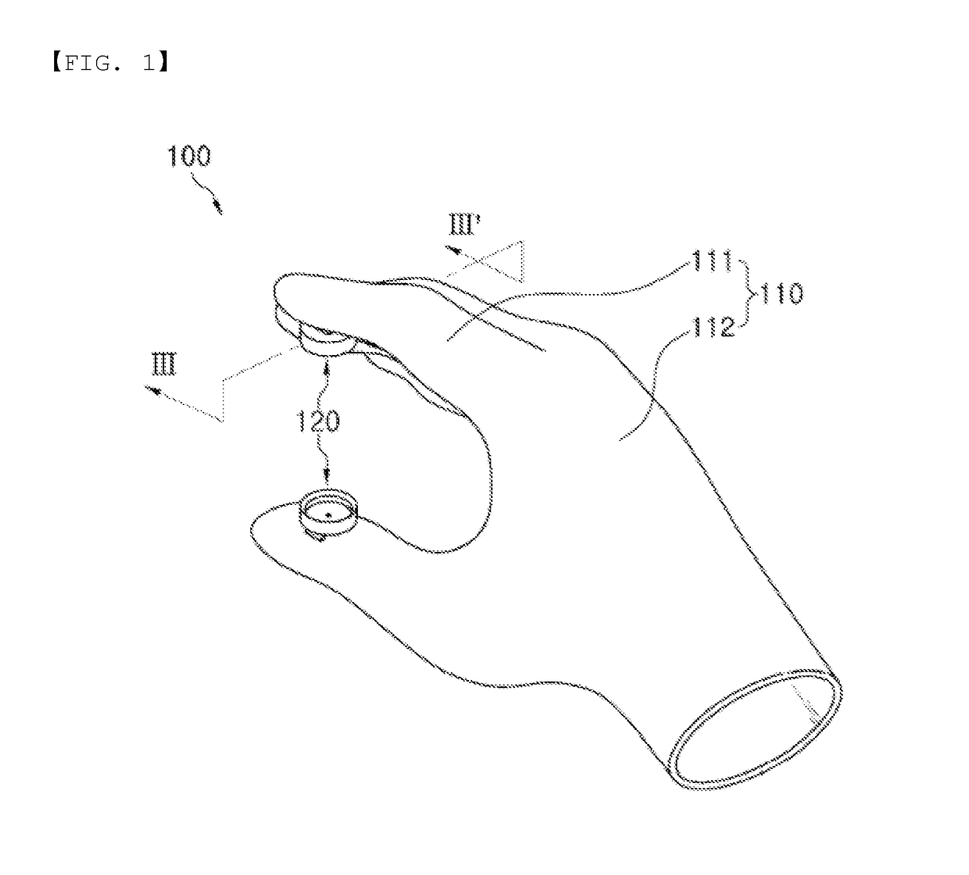
FIG. 1 is a perspective view showing a battery property measurement apparatus according to an embodiment of the present invention.
Figure 2:
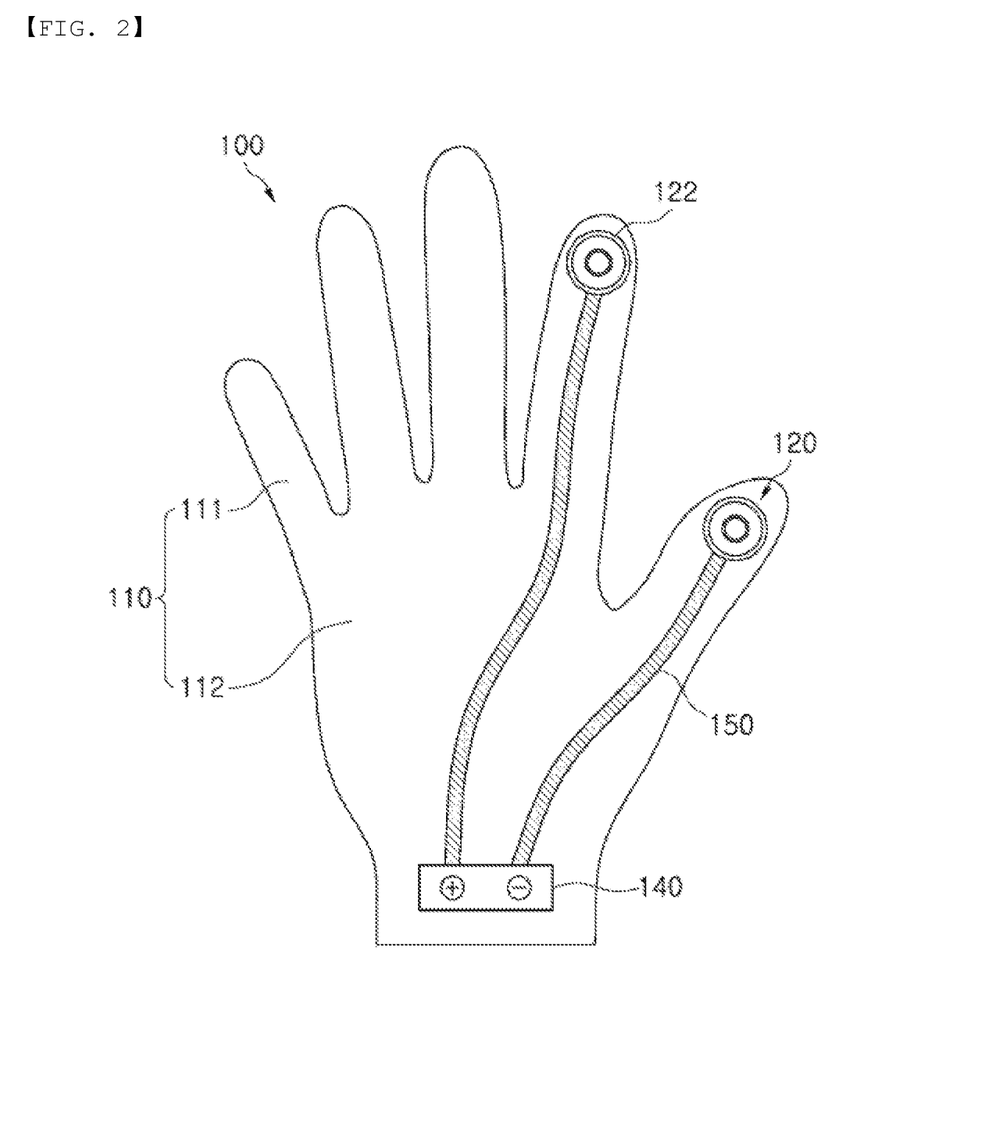
FIG. 2 is a bottom view showing the lower side of the battery property measurement apparatus of FIG. 1.
Figure 3:
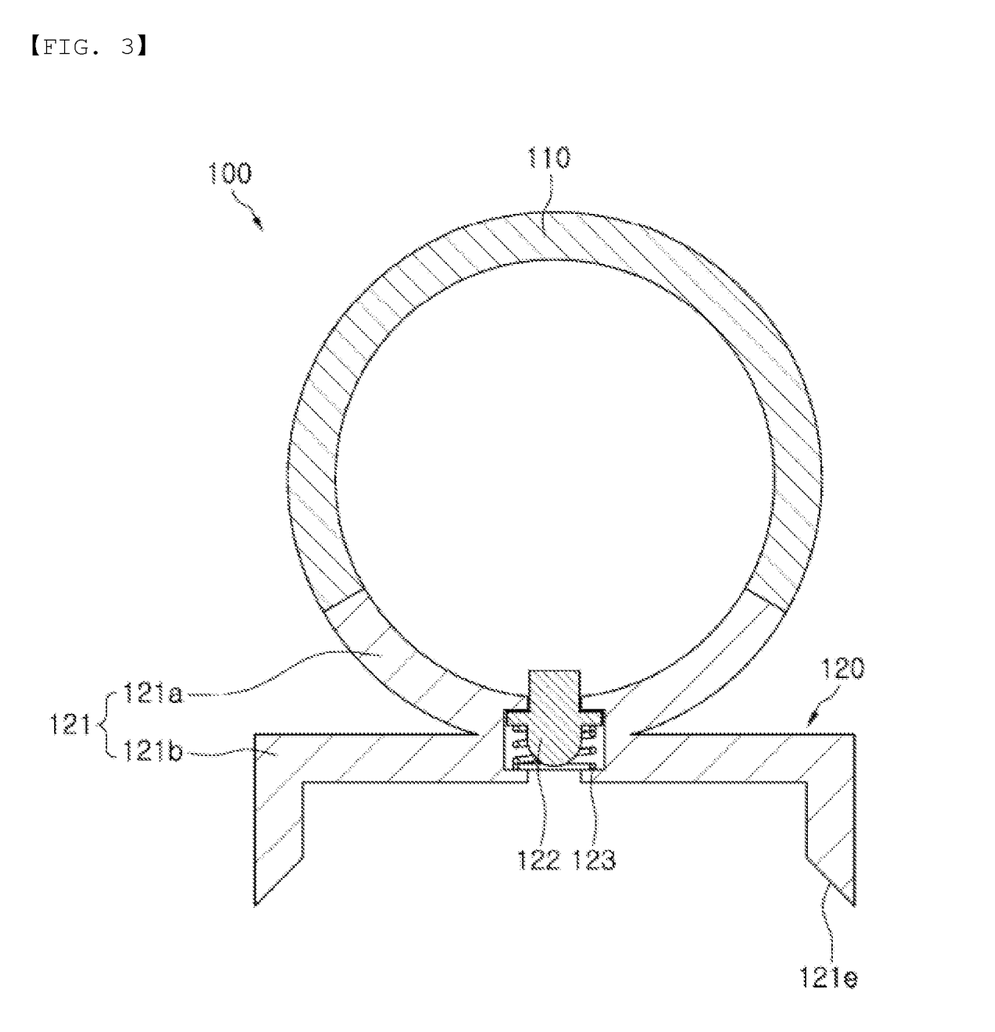
FIG. 3 is a sectional view of the battery property measurement apparatus taken along line III-III' of FIG. 1.

Referring to FIGS. 1 to 3, a battery property measurement apparatus 100 according to an embodiment of the present invention includes a main body 110 and a measurement unit 120.

The main body 110 may be made of an insulative material, and may be put on a hand of a user. The main body 110 may have a shape capable of wrapping the hand of the user. For example, the main body 110 may wrap the fingers, the back, and the palm of the hand.

The main body 110 may include a portion 111 configured to wrap the fingers and a portion 112 configured to wrap the palm and the back of the hand. As an example, the main body 110 may be made of fabric, leather, artificial leather, or synthetic resin. However, the present invention is not limited thereto.

The measurement unit 120 may be installed at the portion 111 of the main body 110, at which a finger of the user is located, and may be configured to wrap at least a portion of each of the opposite ends of a battery. When the user pushes the battery using the fingers in the state in which the measurement unit 120 and the battery are coupled to each other, the measurement unit 120 may be electrically connected to the battery.

Two measurement units 120 may be provided, wherein one measurement unit 120 may be installed at the portion of the main body 110 into which the index finger or the middle finger of the user are inserted, and the other measurement unit 120 may be installed at the portion of the main body 110 into which the thumb of the user is inserted. However, the present invention is not limited thereto. The two measurement units 120 may be coupled to a positive electrode and a negative electrode of the battery. As an example, the battery coupled to the measurement units 120 may be a cylindrical battery.

As an example, the measurement unit 120 may include a positioning member 121, a conductive member 122, and an elastic member 123.

The positioning member 121 may include a base portion 121a and a gripping portion 121b. The base portion 121a may be coupled to the main body 110, and may be formed so as to have a shape capable of wrapping a portion of the finger. As an example, the base portion 121a may have the shape of an arc in vertical section.

Coupling between the base portion 121a and the main body 110 may be achieved by forming a hole (not shown) in one side of the portion of the main body 110 in to which the finger is inserted, manufacturing the base portion 121a in the shape of a ring cut at one side thereof, and the user detachably coupling the base portion 121a to the hole (not shown) formed in the main body 110 in the state of wearing the main body 110. Alternatively, coupling between the base portion 121a and the main body 110 may be achieved by thermal fusion. However, the present invention is not limited thereto.

The gripping portion 121b may wrap a portion of one end of the battery. As an example, the gripping portion 121b may have the shape of a pipe. The inner diameter of the gripping portion 121b may be similar to or slightly greater than the outer diameter of the battery. The gripping portion 121b may grip a portion of the battery such that the conductive member 122 exactly faces an electrode terminal of the battery.

Meanwhile, the inner diameter of the inner surface of the gripping portion 121b may gradually decrease from the tip end thereof to the conductive member 122. That is, an inclined surface 121e may be formed at the inner surface of the gripping portion 121b. Even when the user does not exactly insert the battery into the gripping portion 121b, therefore, the battery may be inserted into the gripping portion 121b along the inclined surface 121e.

The conductive member 122 may be installed in an installation space defined in the positioning member 121, and may be made of a conductive material. As an example, the conductive member 122 may be made of metal or conductive plastic. However, the present invention is not limited thereto.

The conductive member 122 may be moved in the installation space in the direction far from or close to the finger by external force. For example, the conductive member 122 may be moved upwards or downwards based on the directions shown in the figures.

The elastic member 123 may be installed in the installation space of the positioning member 121, and may elastically support the conductive member 122. When the external force applied to the conductive member 122 is removed, the elastic member 123 may apply elastic force such that the conductive member 122 is maintained in the state of being located adjacent to the finger. More specifically, when external force is applied to the upper side of the conductive member 122 based on the directions shown in the figures, the conductive member 122 may be moved downwards. When the external force applied to the upper side of the conductive member 122 is removed, on the other hand, the conductive member 122 may be moved upwards so as to return the initial position thereof, since the elastic member 123 elastically supports the lower side of the conductive member 122. To this end, as an example, the elastic member 123 may be a compression spring.

Meanwhile, in the case in which the conductive member 122 is located at the initial position thereof, the portion of the conductive member 122 adjacent to the main body 110 is preferably located so as to protrude toward the interior of the main body 110. The reason for this is that the finger of the user and the conductive member 122 can smoothly contact each other. Also, in the case in which the conductive member 122 is located at the initial position thereof, the portion of the conductive member 122 adjacent to the outside is preferably located in the installation space without protruding outside. As a result, the conductive member 122 is prevented from being contaminated due to external contact.

The operation of the battery property measurement apparatus 100 according to the embodiment of the present invention including the measurement unit 120 will be described later.

Meanwhile, more specifically, the battery property measurement apparatus 100 according to the embodiment of the present invention may include a coupling member 140 and a connection member 150.

The coupling member 140 may be coupled to the main body 110, and an external device C (see FIG. 4) may be detachably coupled to the coupling member 140. Terminals 140a and 140b configured to allow a positive electrode T1 and a negative electrode T2 of the external device C (see FIG. 4) to be coupled thereto may be located at one side of the coupling member 140. As an example, a method using magnetic force may be applied in order to achieve coupling between the coupling member 140 and the external device C (see FIG. 4). However, the present invention is not limited thereto.

Figure 4:
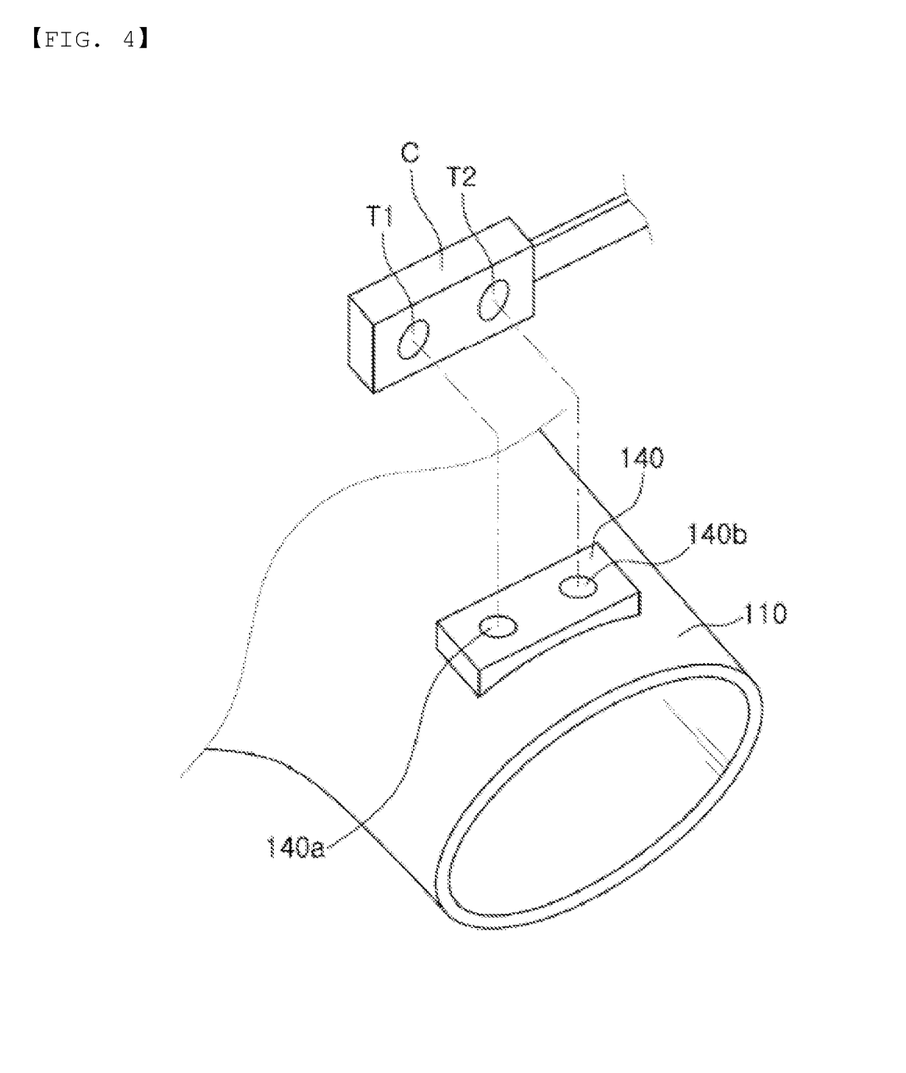
FIG. 4 is a view showing the process in which a coupling member is coupled to an external device in FIG. 2.

The coupling member 140 may be connected to the external device C (see FIG. 4) in order to receive electric power from the external device C (see FIG. 4). In addition, the measurement unit 120 is connected to the battery, and properties of the battery, such as a voltage value or a current value, may be transmitted to the external device C (see FIG. 4) via the coupling member 140. Here, the external device C (see FIG. 4) may be a device capable of measuring one or more of the voltage, current, and internal resistance of the battery.

The connection member 150 may be made of a conductive material, and may be installed at the main body 110. The connection member 150 may electrically connect the measurement unit 120 and the coupling member 140 to each other. To this end, as an example, the connection member 150 may be made of a conductive fiber. In this case, the main body 110 may be made of a general nonconductive fiber, and the coupling member 140 may be manufactured integrally with the main body 110 during a manufacturing process. That is, the portion of the main body 110 that connects the measurement unit 120 and the coupling member 140 to each other may be made of a conductive fiber, which constitutes the connection member 150.

Alternatively, a conductive cable (not shown) may be used as the connection member 150, and the measurement unit 120 and the coupling member 140 may be electrically connected to each other via the conductive cable. However, in the case in which the connection member 150 is manufactured using a conductive fiber, as described above, it is not necessary to realize a structure configured to fix the conductive cable, whereby it is possible to improve durability while easily achieving manufacture.

Hereinafter, the operation of the battery property measurement apparatus 100 according to the embodiment of the present invention will be described in detail with reference to the drawings.

Figure 5:
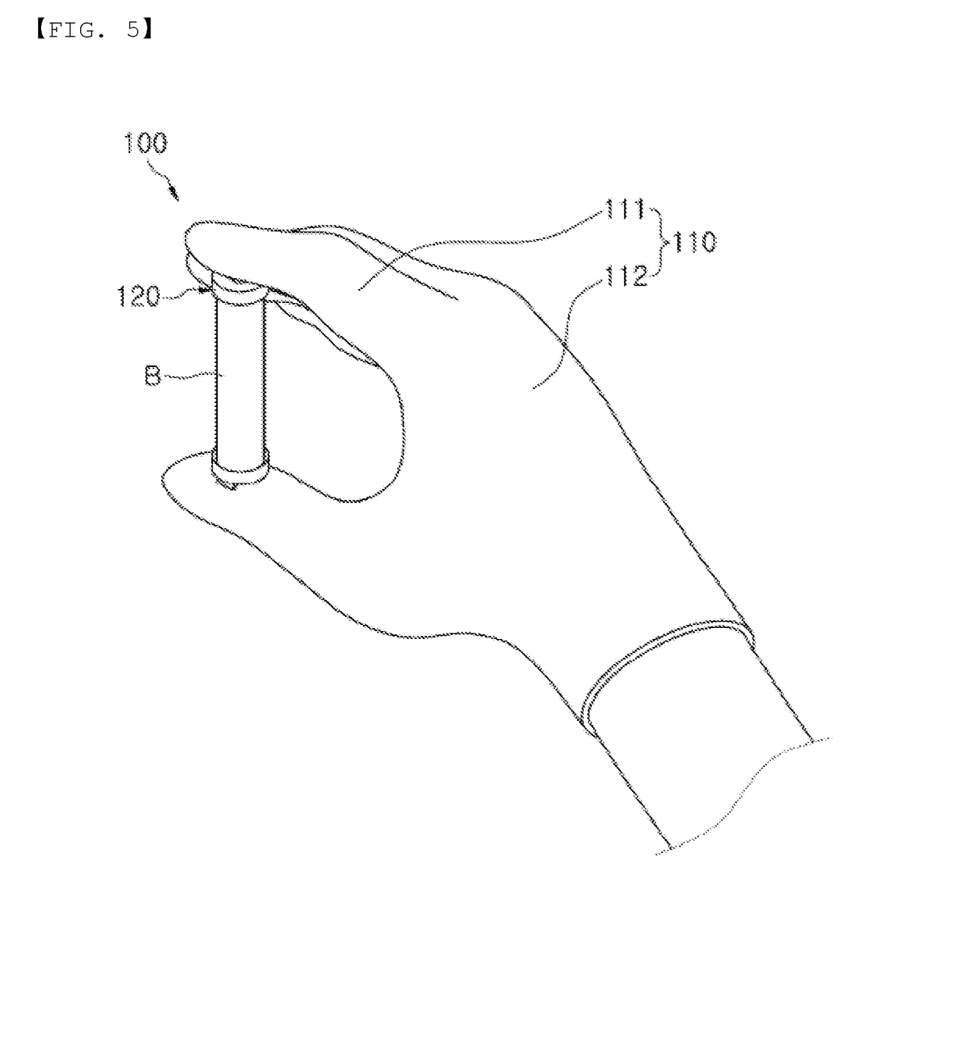
FIG. 5 is a view showing the state in which a user measures properties of a battery using the battery property measurement apparatus.
Figure 6:
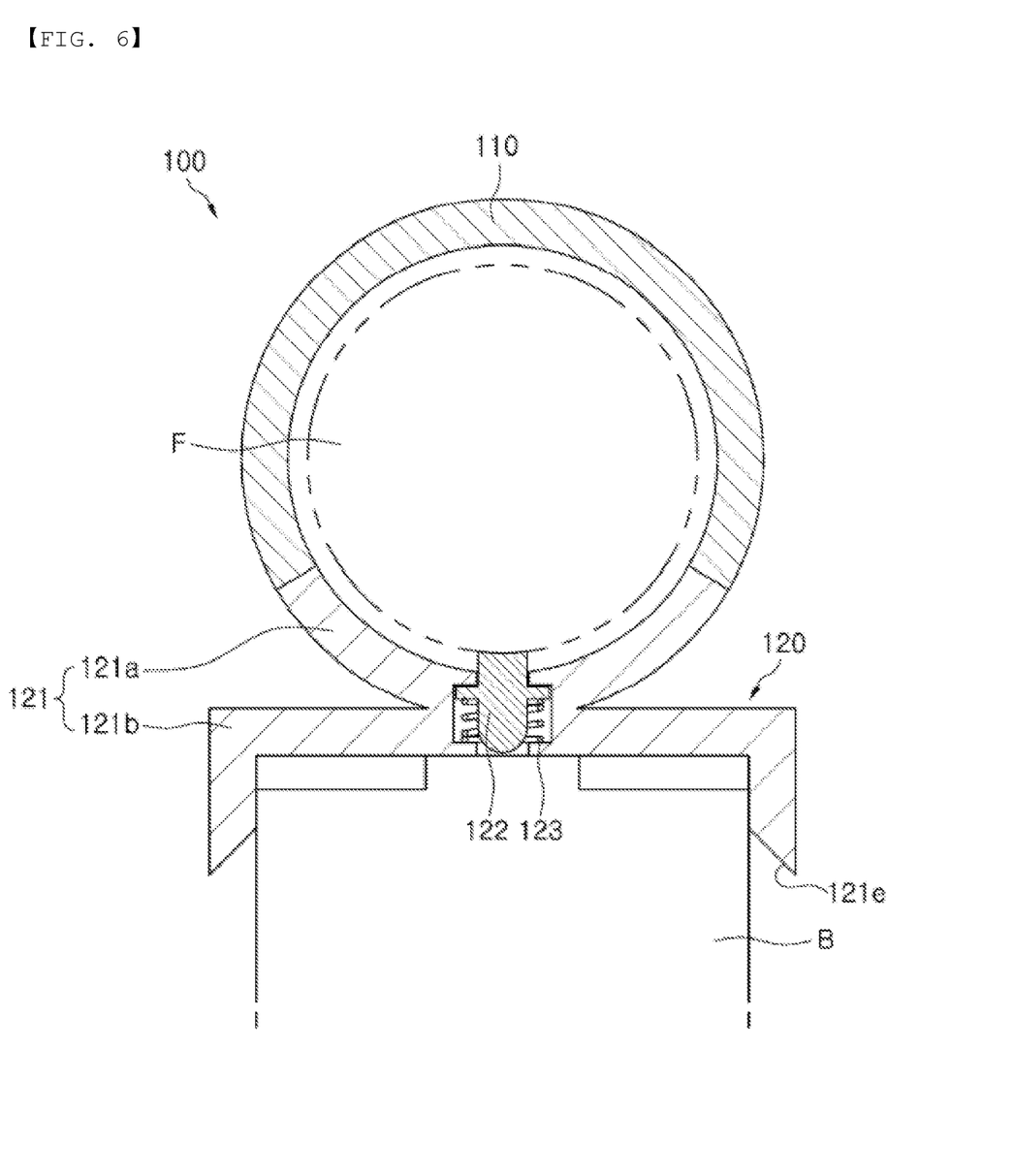
FIG. 6 is a view showing the state before a finger of the user pushes a conductive member.

The user puts the battery property measurement apparatus 100 on a hand, and couples the external device C to the coupling member 140. Subsequently, as shown in FIG. 5, the user couples the two measurement units 120 of the battery property measurement apparatus 100 to opposite ends of a battery B, respectively. At this time, as shown in FIG. 6, the conductive member 122 may not protrude from the installation space due to the elastic member 123 in the state in which a finger F of the user does not push the conductive member 122. Consequently, it is possible to prevent the conductive member 122 and an electrode terminal of the battery B from contacting each other.

Figure 7:
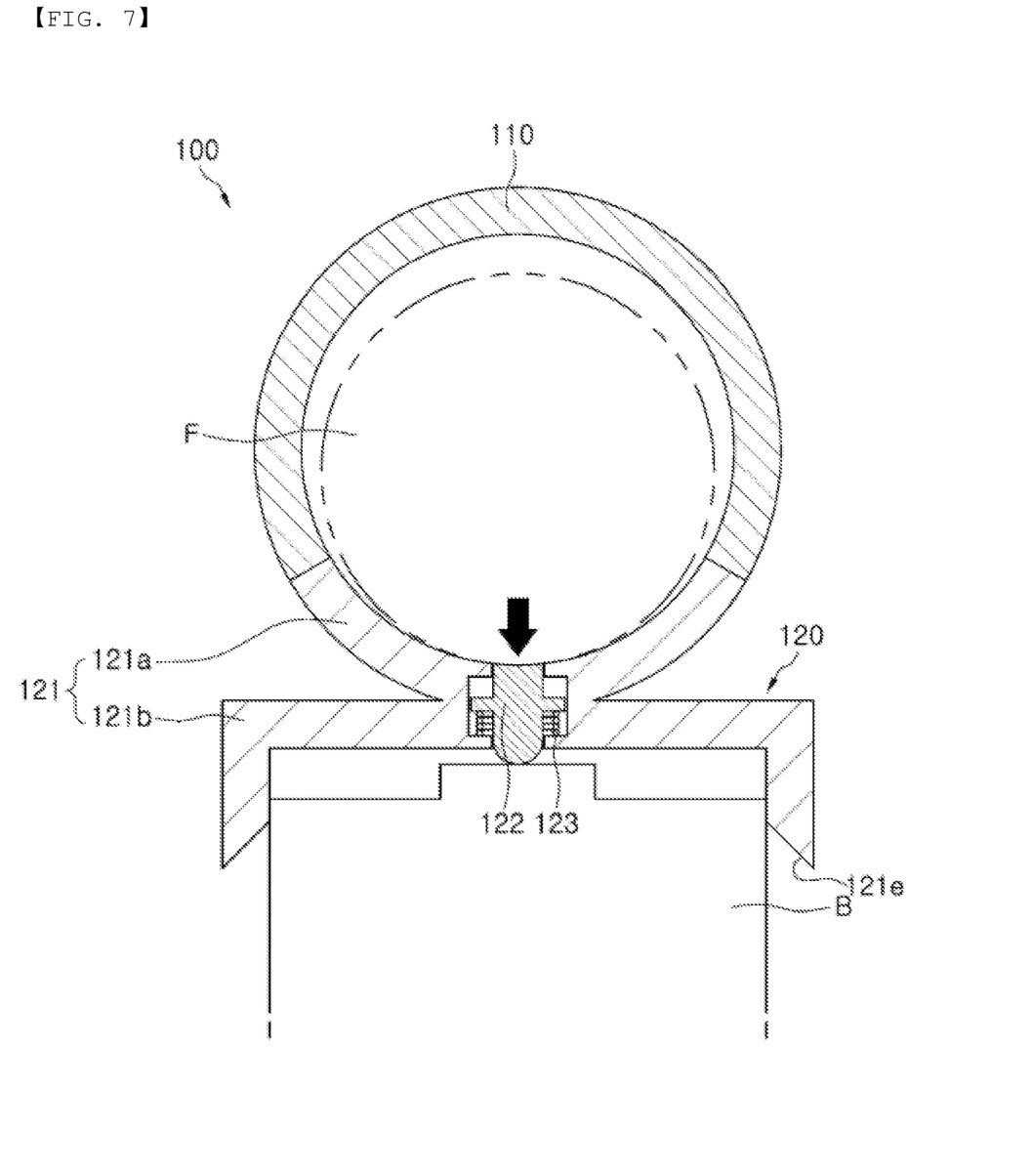
FIG. 7 is a view showing the state after the finger of the user pushes the conductive member.

Subsequently, as shown in FIG. 7, when the user moves the finger F to push the conductive member 122, the conductive member 122 may be moved toward the battery B, and therefore the conductive member 122 and the electrode terminal of the battery B may come into contact with each other. At this time, properties of the battery B, such as voltage or current, may be transmitted to the external device C via the coupling member 140. Since the positioning member 121 grips the battery B, the conductive member 122 may exactly contact the electrode terminal of the battery B.

For a general battery, internal resistance as well as voltage is a very important element in terms of battery properties. Since a battery includes an impedance component due to electrochemical reaction, it is not possible to measure internal resistance using a generally known dc resistance measurement method.

In order to measure internal resistance of a battery, a Cole-Cole plot is drawn while changing frequency, and then internal resistance is measured. In the case in which this process is not performed in a stable state (contact position, contact state, and surface state), results may be inaccurate, or a long time may be taken to measure internal resistance.

In the battery property measurement apparatus 100 according to the embodiment of the present invention, the conductive member 122 exactly contacts the electrode terminal of the battery due to the positioning member 121 included in the measurement unit 120. In the case in which properties of manufactured batteries are continuously measured, therefore, the conductive member 122 may constantly contact the same specific positions of the electrode terminals of the batteries. Consequently, it is possible to reduce a measurement error at the time of battery property measurement, and even when a user other than a skilled user performs measurement, the conductive member 122 may constantly contact the same specific positions of batteries. In addition, battery property measurement may be accurately performed, and measurement time may be remarkably reduced.

Also, in the battery property measurement apparatus 100 according to the embodiment of the present invention, the positioning member 121 grips the battery, whereby it is possible to prevent the surface of the electrode terminal of the battery from being scratched due to contact between the conductive member 122 and the battery in the state in which the battery is fixed.

Furthermore, in the case in which properties of the battery are measured, it is possible to remarkably reduce occurrence of human error depending on users. In the case in which the user does not measure properties of the battery using the battery property measurement apparatus 100, on the other hand, the conductive member 122 is located in the installation space, whereby contamination of the conductive member 122 may be minimized, and therefore it is possible to prevent internal resistance of the battery from being wrongly measured due to contaminants that may be generated on the surface of the conductive member 122.

Figure 8:
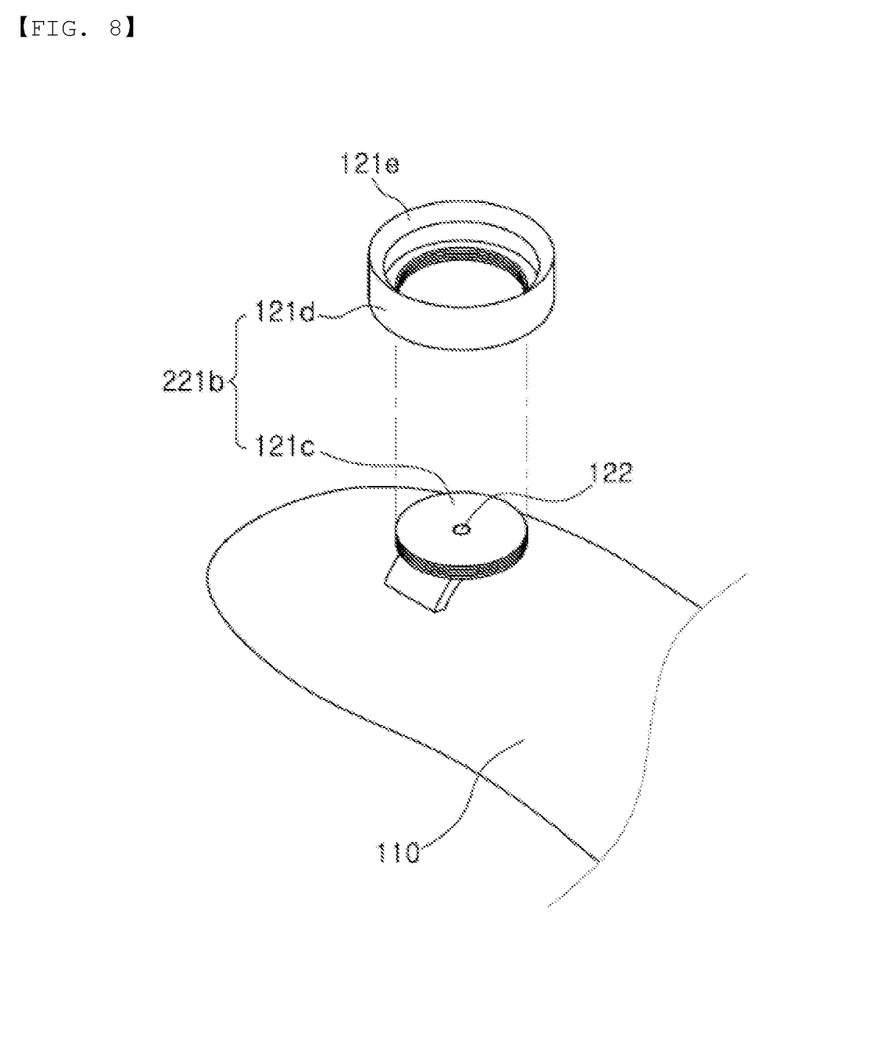
FIG. 8 is a view showing a modification of a gripping portion included in a positioning member.

Referring to FIG. 8, a modification of the gripping portion 221b included in the positioning member 121 may include a fixing portion 121c and a detachment portion 121d.

The fixing portion 121c may be fixed and coupled to the base portion 121a. The fixing portion 121c may be formed integrally with the base portion 121a. The electrode terminal of the battery may contact the fixing portion 121c.

The detachment portion 121d may be detachably coupled to the fixing portion 121c, and may wrap a portion of one end of the battery. To this end, as an example, the detachment portion 121d may have the shape of a ring. As an example, coupling between the detachment portion and the fixing portion 121c may be achieved using a screw engagement method.

A cylindrical battery may be classified as an 18650 battery or a 21700 battery depending on the diameter thereof. The 18650 battery has a diameter of 18 mm, and the 21700 battery has a diameter of 21 mm. The inner diameter of the detachment portion 121d described above may correspond to the outer diameter of the 18650 battery, and may correspond to the outer diameter of the 21700 battery. That is, in the state in which detachment portions 121d having various diameters are prepared, a detachment portion 121d corresponding to a battery having a specific diameter and a fixing portion 121c may be coupled to each other to manufacture a battery property measurement apparatus 100 according to another embodiment of the present invention. Consequently, it is not necessary to manufacture a variety of molds in order to manufacture battery property measurement apparatuses 100 corresponding to various sizes of batteries, whereby it is possible to remarkably reduce manufacturing cost.

Also, in the case in which the user continuously measures properties of 18650 batteries using the battery property measurement apparatus 100 and then measures properties of a battery having a diameter different from the diameter of the 18650 battery, only the detachment portion 121d may be simply replaced to measure properties of batteries manufactured to have various diameters. That is, it is not necessary to provide all battery property measurement apparatuses 100 suitable for batteries having various diameters, whereby it is possible to reduce cost incurred at the time of battery property measurement.

Figure 9:
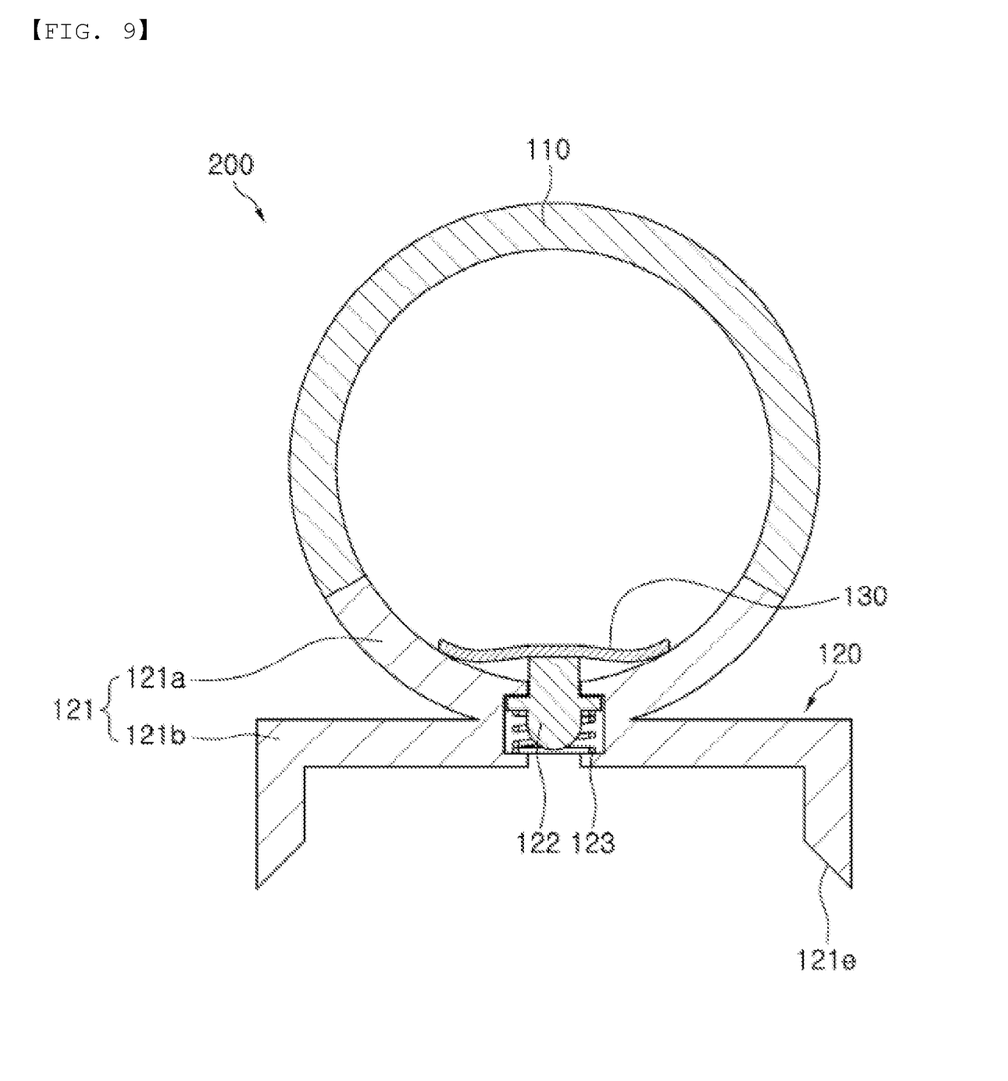
FIG. 9 is a perspective view showing a battery property measurement apparatus according to another embodiment of the present invention.

Referring to FIG. 9, a battery property measurement apparatus 100 according to another embodiment of the present invention may further include an insulative member 130.

The insulative member 130 may be made of a material that is insulative and elastically deformable, and may be installed in the main body 110. As an example, insulative member 130 may be a plate-shaped member made of rubber or silicone.

The insulative member 130 may be installed so as to wrap the portion of the conductive member 122 that contacts the finger. More specifically, the insulative member 130 is located in the main body 110 while having a larger size than the conductive member 122 in order to cover the conductive member 122 and the portion of the main body 110 therearound. The insulative member 130 may be coupled to the main body 110. As an example, a method using an adhesive material or a thermal fusion method may be used in order to achieve coupling between the insulative member 130 and the main body 110. However, the present invention is not limited thereto.

Although the present invention has been described with reference to various embodiments, the drawings referred to above and the detailed description of the invention described above are merely illustrative, are only used in order to describe the present invention, and are not used to restrict meanings or to limit the scope of the present invention described in the claims. Therefore, it can be understood by a person having ordinary skill in the art to which the present invention pertains that various modifications and equivalences are possible therefrom. Accordingly, the true scope of right of the present invention should be determined by the technical idea of the claims.

| (Description of Reference Symbols) | |
|---|---|
| 100: Battery property measurement apparatus | |
| 110: Main body | 120: Measurement unit |
| 121: Positioning member | 121a: Base portion |
| 121b, 221b: Gripping portions | 121c: Fixing portion |
| 121d: Detachment portion | 122: Conductive member |
| 123: Elastic member | 130: Insulative member |
| 140: Coupling member | 150: Connection member |

INDUSTRIAL APPLICABILITY

In the battery property measurement apparatus according to the embodiment of the present invention, the conductive member exactly contacts the electrode terminal of the battery due to the positioning member included in the measurement unit. In the case in which properties of manufactured batteries are continuously measured, therefore, the conductive member may constantly contact the same specific positions of the electrode terminals of the batteries. Consequently, it is possible to reduce a measurement error at the time of battery property measurement, and even when a user other than a skilled user performs measurement, the conductive member may constantly contact the same specific positions of batteries. In addition, battery property measurement may be accurately performed, and measurement time may be remarkably reduced.

Also, in the battery property measurement apparatus according to the embodiment of the present invention, the positioning member grips the battery, whereby it is possible to prevent the surface of the electrode terminal of the battery from being scratched due to contact between the conductive member and the battery in the state in which the battery is fixed.

Furthermore, in the case in which properties of the battery are measured, it is possible to remarkably reduce occurrence of human error depending on users. In the case in which the user does not measure properties of the battery using the battery property measurement apparatus, on the other hand, the conductive member is located in the installation space, whereby contamination of the conductive member may be minimized, and therefore it is possible to prevent internal resistance of the battery from being wrongly measured due to contaminants that may be generated on the surface of the conductive member.

The invention claimed is:

1. A battery property measurement apparatus comprising:
   a main body made of an insulative material, the main body being configured to be put on a hand of a user; and
   a measurement unit installed at a portion of the main body at which a finger of the user is located, the measurement unit being configured to contact at least a portion of respective opposite ends of a battery, the measurement unit being electrically connected to the battery when the user push on the battery using the finger in a state in which the battery is coupled to the measurement unit,
   wherein the measurement unit comprises:
      a positioning member comprising a base portion coupled to the main body, a gripping portion, and an installation space forming a through hole extending from the base portion to the gripping portion, wherein the base portion is formed so as to have a shape capable of wrapping a portion of the finger, and the gripping portion is configured to contact a portion of one end of the battery;
      a conductive member installed in the installation space defined in the positioning member, the conductive member being made of a conductive material, the conductive member being configured to be moved in the installation space in a direction away or toward the finger by an external force, and the conductive member having a first end located at the base portion and a second end located at the gripping portion; and
      an elastic member installed in the installation space, the elastic member being configured to elastically support the conductive member, the elastic member applying an elastic force such that the conductive member is maintained in a state of being located adjacent to the finger when the external force applied to the conductive member is removed,
      wherein the first end of the conductive member sticks out of the installation space at the base portion when the external force applied to the conductive member is removed.

2. The battery property measurement apparatus according to claim 1, wherein the gripping portion of the positioning member comprises:
   a fixing portion fixed and coupled to the base portion; and
   a detachment portion detachably coupled to the fixing portion, the detachment portion being configured to contact the portion of one end of the battery.

3. The battery property measurement apparatus according to claim 2, wherein the detachment portion has a ring shape.

4. The battery property measurement apparatus according to claim 2, wherein an inner diameter of an inner surface of the gripping portion gradually decreases from a tip end thereof to the conductive member.

5. The battery property measurement apparatus according to claim 1, wherein the elastic member is a compression spring.

6. The battery property measurement apparatus according to claim 1, wherein an inner diameter of an inner surface of the gripping portion gradually decreases from a tip end thereof to the conductive member.

7. The battery property measurement apparatus according to claim 1, further comprising an insulative member made of a material that is insulative and elastically deformable, the insulative member being installed in the main body, and the insulative member being installed so as to wrap a portion of the conductive member that contacts the finger.

8. The battery property measurement apparatus according to claim 1, comprising:
   a coupling member coupled to the main body, an external device being detachably coupled to the coupling member; and
   a connection member made of a conductive material, the connection member being installed at the main body, and the connection member being configured to electrically connect the measurement unit and the coupling member to each other.

9. The battery property measurement apparatus according to claim 8, wherein the connection member is made of a conductive fiber.

10. The battery property measurement apparatus according to claim 8, wherein the external device is configured to measure one or more of voltage, current, and internal resistance of the battery.

11. The battery property measurement apparatus according to claim 1, wherein the measurement unit includes a first measurement unit to contact a first end of the opposite ends of the battery, and a second measurement unit to contact a second end of the opposite ends of the battery.

12. The battery property measurement apparatus according to claim 11, wherein the first measurement unit is installed on one of an index finger or a middle finger of the user, and the second measurement unit is installed on a thumb of the user.

13. The battery property measurement apparatus according to claim 1, wherein the second end of the conductive member sticks out of the installation space at the gripping portion when the external force is applied to the conductive member.

* * * * *